United States Patent
Bartley et al.

(10) Patent No.: US 10,955,568 B2
(45) Date of Patent: Mar. 23, 2021

(54) X-RAY SENSITIVE DEVICE TO DETECT AN INSPECTION

(71) Applicant: International Business Machines Corporation, Armonk, NY (US)

(72) Inventors: Gerald Bartley, Rochester, MN (US); Matthew Doyle, Chatfield, MN (US); Mark J. Jeanson, Rochester, MN (US); Darryl Becker, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/270,631

(22) Filed: Feb. 8, 2019

(65) Prior Publication Data
US 2020/0257005 A1  Aug. 13, 2020

(51) Int. Cl.
| | | |
|---|---|---|
| G01T 1/24 | (2006.01) | |
| H01L 27/30 | (2006.01) | |
| H01L 51/00 | (2006.01) | |
| H01G 9/20 | (2006.01) | |
| H01L 51/42 | (2006.01) | |

(52) U.S. Cl.
CPC .............. *G01T 1/24* (2013.01); *H01G 9/2009* (2013.01); *H01L 27/308* (2013.01); *H01L 51/0077* (2013.01); *H01L 51/4253* (2013.01)

(58) Field of Classification Search
None
See application file for complete search history.

(56) References Cited

U.S. PATENT DOCUMENTS

| | | |
|---|---|---|
| 7,335,899 B2 | 2/2008 | Blanton et al. |
| 7,498,644 B2 | 3/2009 | Shapiro et al. |
| 7,551,722 B2 | 6/2009 | Ohshima et al. |
| 8,455,990 B2 | 6/2013 | Warren et al. |
| 8,489,901 B2 | 7/2013 | Boudreaux |
| 8,586,871 B2 | 11/2013 | Bernstein et al. |
| 10,598,613 B2 | 3/2020 | Pipino |
| 2013/0141137 A1 | 6/2013 | Krutzik et al. |
| 2015/0092925 A1* | 4/2015 | Stoupin ............... G01T 1/26 378/145 |
| 2016/0349088 A1 | 12/2016 | Patel |
| 2019/0148659 A1* | 5/2019 | Jung et al. .......... H01L 51/4253 |
| 2020/0072986 A1 | 3/2020 | Cao et al. |

OTHER PUBLICATIONS

Krastev et al., "Recent Advances in the X-Ray Inspection Technology With Emphasis on Large Board Computer Tomography and Automation", 8 pages http://www.nordson-at.com/technology/up_img/1428036789-103009.pdf.

(Continued)

*Primary Examiner* — Hoon K Song
(74) *Attorney, Agent, or Firm* — Daniel M. Yeates

(57) ABSTRACT

Disclosed is a device for detecting non-intrusive inspections. The device includes an electrical component with a first end cap and a second end cap. Additionally, the device includes an x-ray sensitive material electrically coupling the first end cap and the second end cap. The x-ray sensitive material has a first state having a first conductivity and a second state having a second conductivity. The sensing material is configured to transform from the first state to the second state when exposed to an initiating voltage.

19 Claims, 8 Drawing Sheets

(56) References Cited

OTHER PUBLICATIONS

Unknown, "Using Computer Tomography for 3D Board Level X-Ray Inspection", AZO Materials, Jan. 28, 2015, 15 pages, http://www.azom.com/article.aspx?ArticleID=11686.

Wikipedia, "FIPS 140-2", From Wikipedia, the free encyclopedia, last edited on Oct. 29, 2018, 5 pages https://en.wikipedia.org/wiki/FIPS_140-2.

Chandler, D., "Switchable material could enable new memory chips", MIT Engery Initiative, Jan. 20, 2016, 3 pages.

* cited by examiner

X-RAY SENSITIVE DEVICE TO DETECT AN INSPECTION

BACKGROUND

The present disclosure relates to information protection, and, more specifically, to detecting inspections of a component.

The protection of information is an important attribute throughout the electronic and computer industry. Various tamper evident and/or tamper resistant techniques are built into sensitive features of components and processes in order to protect data, methodologies, and encryption schemes. Laboratory tools, such as X-ray inspection systems, aid in the reverse engineering of structures that may enable unauthorized access to confidential information.

SUMMARY

Disclosed is a device for detecting non-intrusive inspections. The device includes an electrical component with a first and a second end cap. Additionally, the component includes an x-ray sensitive material physically contacting the first end cap and the second end cap. The x-ray sensitive material has a first state having a first conductivity and a second state having a second conductivity. The sensing material is configured to transform from the first state to the second state when exposed to an initiating voltage.

Also disclosed is an x-ray sensing device where strontium cobaltite physically contacts a first end cap and a second end cap of an electrical component. The strontium cobaltite has a first state having a first conductivity and a second state having a second conductivity. The device includes a component for measuring conductivity between the first end cap and the second end cap.

A method of using the device to detect an x-ray inspection is also disclosed. The method can include monitoring a first x-ray detecting device, where the first x-ray detecting device comprises an x-ray sensitive material physically contacting a first end cap and a second end cap, where the x-ray sensitive material has a first state having a first conductivity and a second state having a second conductivity, and where the x-ray sensitive material is configured to transform from the first state to the second state in response to an initiating voltage. The method can further comprise determining an x-ray inspection occurred by detecting a change in conductivity between the first end cap and the second end cap. The method can further comprise performing, in response to determining the x-ray inspection occurred, an action.

The present Summary is not intended to illustrate each aspect of, every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
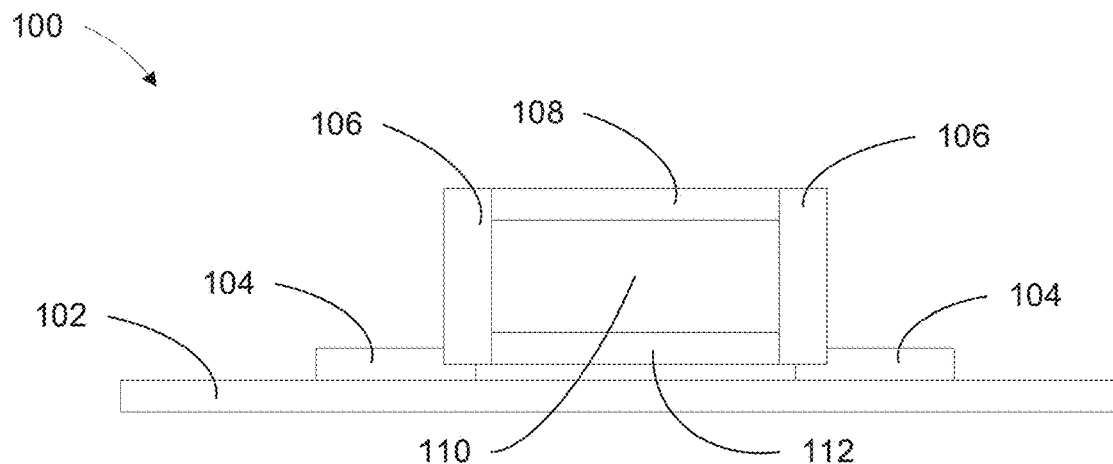
FIG. 1A illustrates a cross-section of a resistor configured as an x-ray detection device in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Embodiments of the present disclosure relate to information security, and, more specifically, to detecting x-ray inspection of a component. While not limited to such applications, aspects of the present disclosure may be better appreciated in light of the aforementioned applications.

The protection of information is an important attribute throughout the electronic and computer industry. Various tamper evident and/or tamper resistant techniques are built into sensitive features of components and processes to protect data, methodologies, and encryption schemes. Laboratory tools, such as X-ray inspection systems, aid in the reverse engineering of structures that may enable unauthorized access to confidential information.

The capabilities of these inspection tools continue to expand. New approaches designed to shield, obfuscate, or camouflage critical information against these new inspection tools need to be developed.

Thus, embodiments of the present disclosure provide a device configured to detect a non-intrusive x-ray inspection. This reduces the need to continuously improve the shield, obfuscate, and/or camouflage functionality required to maintain secrecy. Embodiments of the present disclosure allow for detection and reaction to attempted, unauthorized inspections, rather than, or in conjunction with, a strategy of preventing/obscuring inspections.

Embodiments of the present disclosure include a device that detects x-rays in the vicinity of the device. In some embodiments the device can act like an x-ray sensor or can be considered an x-ray sensor. In various embodiments, the x-ray detector can be paired with a component. The component can be any type of component generally used on a circuit board, or in any part of a computer system including but not limited to, capacitors, resistors, inductors, and other similar components. For example, the device can be paired with a resistor such that any x-ray beam that scans the resistor will also activate the x-ray sensor. In some embodiments, the x-ray sensor can be deployed at any location on a circuit board or in a computer system to detect x-rays in the vicinity of the sensor. This can be useful to determine the scope of an x-ray inspection. For example, if there are many x-ray detectors scattered across a circuit board and all of them on one half of the circuit board have been activated, it can be deduced that half of the circuit board was scanned. Or, if each component along a circuit flow path has a sensor, and each of the sensors have been activated, then it can be deduced an inspection of that flow path was performed.

In some embodiments, the x-rays can be detected by an x-ray sensing material. In some embodiments, the x-ray sensing material can change state in response to being exposed to x-ray radiation. In some embodiments, the x-ray sensing material can change states in the presence of a voltage. In some embodiments, the voltage that causes the change in state is approximately equal to the voltage produced by exposure to an x-ray beam.

In some embodiments, the x-ray sensing material that can change state is strontium cobaltite. In some embodiments, the x-ray sensing material has two stable states, in the first state the material acts as an insulator, and in the second state the material acts as a conductor. In some embodiments, the material in one state has a perovskite crystal structure, and in the other state the material has a brownmillerite crystal structure. In some embodiments, the material can alternate between the two states based on the voltage that is being applied. For example, if a positive voltage causes the material to transform from the first state to the second state, the negative voltage of a similar magnitude will cause the material to transform back to the first state. In some embodiments, the x-ray sensing material can have a varying conductivity based on whether the material is in the first state or the second state.

In some embodiments, the x-ray detection device can be a capacitor or a capacitor like device. A capacitor is two electrical conductors separated by a dielectric. The dielectric is generally a non-conductive material. Applying a voltage across the capacitor causes a build up of electric charge on the conductors of the capacitor.

In embodiments of the present disclosure, the dielectric can be the x-ray sensing material. In one state the dielectric acts as an insulator or semiconductor, and in another state, the dielectric acts as a conductor. When the dielectric is in the insulating state, the device can operate as a standard capacitor. When the state of the dielectric changes to a conductor, the capacitor then acts as a short and causes a change in the properties of the circuit, thereby allowing detection of the x-ray beam.

In some embodiments, the x-ray detecting device acts as a switch. For example, the initial state of the switch is open. When an x-ray is detected, the x-ray sensing material transforms from an insulator to a conductor, thereby closing (e.g., completing) a circuit (e.g., having the same effect as closing a switch). Closing a circuit can change properties of the circuit, allowing for detection of the x-ray beam.

In some embodiments, the x-ray detection device can be a single component as part of a larger circuit or machine. In some embodiments there can be a plurality of x-ray detection devices on a circuit board or in a machine.

Embodiments of the present disclosure allow for the detection of an x-ray inspection without having permanent, negative effects on the functionality of the device or circuit in which it is deployed. In some embodiments, an x-ray inspection is detected without causing any damage to the component, or any circuit board on which the component resides. In some embodiments, the device is configured such that detecting an x-ray beam causes a resulting action (e.g., turning on a light, sounding an alarm, issuing a notification, etc.) that can be designed into the system.

Generally, sensors are energized before they can sense, and generally x-ray inspections are completed when the device is deenergized (e.g. a card taken out of a server). Embodiments of the present disclosure overcome these conflicting processes. Embodiments of the present disclosure provide a non-volatile memory configured to record attempted x-ray inspection of the device. This provides an advantage over some current obfuscation methods. Embodiments of the present disclosure can detect an x-ray inspection of a component while the component is deenergized and effectively store that an inspection occurred until after the component is re-energized. As an example, assume a card is removed from a server, inspected by x-ray, and returned to the server. According to such an example, embodiments of the present disclosure allow for detection of that inspection agnostic to when the scan took place.

Embodiments of the present disclosure allow for a reusable x-ray detection device, thereby allowing for the x-ray sensing device to detect multiple occurrences of an inspection. In such embodiments, the x-ray sensing material is restored to its original state between each detection. In some embodiments, the material can be reset in response to detecting an inspection and carrying out the predetermined event. In some embodiments, the material can be restored to the original state by a recharging circuit.

The aforementioned advantages are example advantages, and embodiments exist that can contain all, some, or none of the aforementioned advantages while remaining within the spirit and scope of the present disclosure.

FIG. 1A depicts a cross section of x-ray detection device 100 in accordance with embodiments of the present disclosure. X-ray detection device 100 is coupled with a resistor. X-ray detection device 100 includes circuit board 102, copper pads 104, end caps 106, resistor 108, insulator 110, and sensing material 112. Circuit board 102 can be any support structure on which components, such as an x-ray detector, can be mounted. In some embodiments circuit board 102 can be a circuit board or a printed circuit board. Circuit board and printed circuit board can be used interchangeably. A circuit board can mechanically support electronic components and the electrical connections between components.

Copper pads 104 can be any conductive material configured to provide a mechanical and electrical connection between circuit board 102 and the rest of the electrical component. In some embodiments, copper pads 104 provide a mechanical and electrical connection between an electrical component and circuit board 102. Copper pads 104 can be a small surface of copper on a circuit board. In some embodiments copper pads 104 are thru-hole type connections. In some embodiments, copper pads 104 are surface mount type connections.

End caps 106 can be a conductive material configured to pass electrical current between the electronic component and circuit board 102 through copper pads 104. In some embodiments, end caps 106 serve the additional function of being conductive plates of a capacitor.

Resistor 108 is a device that resists current flow in an electrical circuit. Generally, a resistor is a device having a designed resistance to the passage of an electrical current. In some embodiments, resistor 108 can be made of any material known in the art to resist current flow. In some embodiments, resistor 108 is made of carbon. In some embodiments, resistor 108 can be made of metal, or a metal oxide film.

Insulator 110 provides filler material and insulation for resistor 108. In some embodiments, insulator 110 is a ceramic. Ceramic can be a solid material comprising an inorganic compound of metal, non-metal, or metalloid atoms. Insulator 110 can be made of any material known in the art that can act as the body or the insulator to resistor 108.

Sensing material 112 can be any material that changes state in the presence of an x-ray. In some embodiments, sensing material 112, is the x-ray sensitive material as previously described. In some embodiments, sensing material 112 is strontium cobaltite. In some embodiments, sensing material 112 has a first conductivity in the first state (e.g., a perovskite structure) and a second conductivity in the second state (e.g., a brownmillerite structure).

X-ray detection device 100 can be configured such that the first state of sensing material 112 acts as an insulator having a first conductivity. In that case, the only flow path for current through x-ray detection device 100 is from circuit board 102 through copper pad 104, end cap 106, resistor 108, through the other end cap 106, copper pad 104 and back to circuit board 102. After an x-ray inspection of the device, sensing material 112 can switch to a second state having a second conductivity and allow for a second electrical flow path through sensing material 112. The second electrical flow path will change the overall characteristics of the circuit. Those changes can be measured and reveal the x-ray inspection has occurred.

While the previous example discussed the first state acting as an insulator and the second state acting as a conductor, the opposite can also occur, where the initial state of sensing material 112 can be as a conductor and the second state as an insulator. The changes in the circuit can be detected regardless of the initial state of sensing material 112.

In some embodiments, the rectangular space defined by the boundaries of circuit board 102, copper pad 104, and sensing material 112 is void space. It can be filled by air or some other material. In some embodiments, sensing material 112 is in contact with circuit board 102, thereby eliminating the space between the two parts.

Figure 1B:
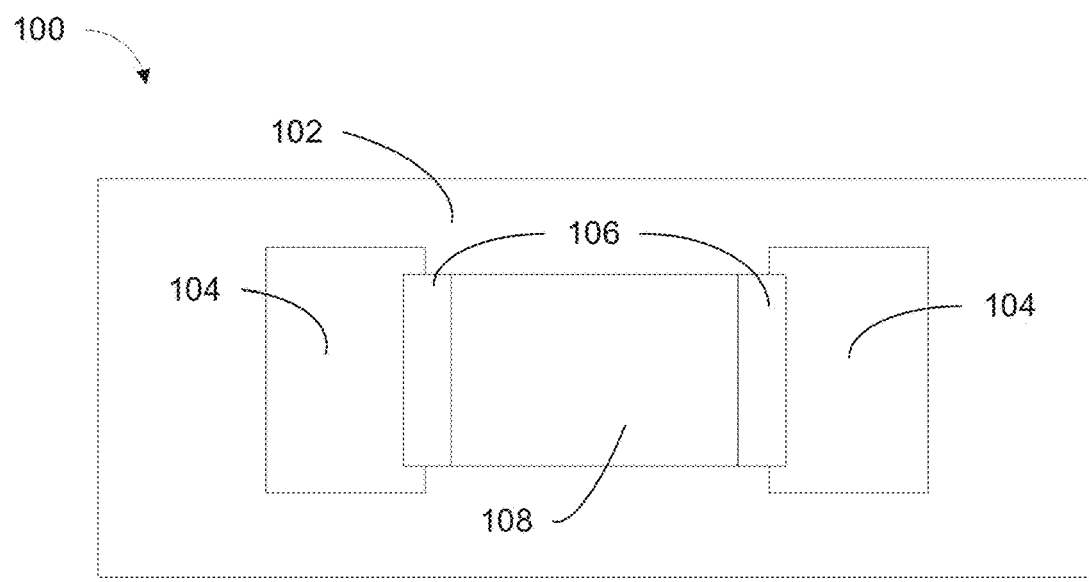
FIG. 1B illustrates a top down view of a resistor configured as an x-ray detection device in accordance with some embodiments of the present disclosure.

FIG. 1B depicts a top down view of x-ray detection device 100 consistent with embodiments of the present disclosure. Circuit board 102, Copper pads 104, end caps 106, and resistor 108 are depicted. Insulator 110 and sensing material 112 are blocked from view by resistor 108.

Figure 1C:
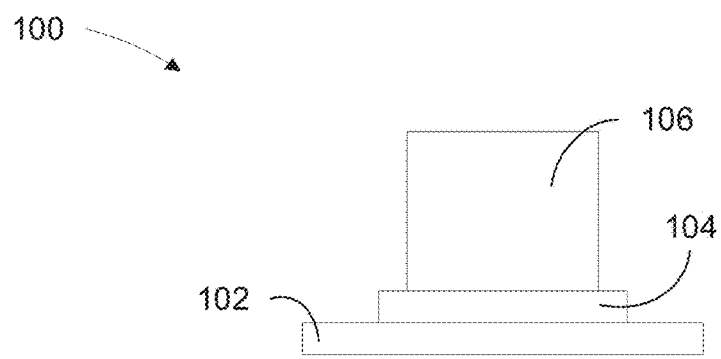
FIG. 1C illustrates a side view of a resistor configured as an x-ray detection device in accordance with some embodiments of the present disclosure.

FIG. 1C depicts a side view of x-ray detection device 100 consistent with embodiments of the present disclosure. Circuit board 102, Copper pads 104, and end caps 106 are depicted. The other components are blocked from view.

Figure 2A:
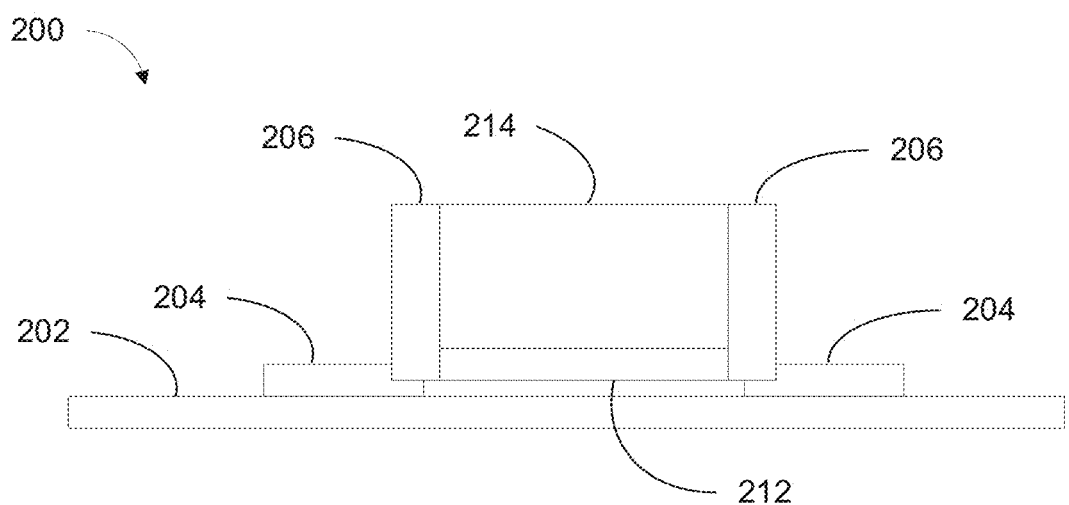
FIG. 2A illustrates a cross-section of a capacitor configured as an x-ray detection device in accordance with some embodiments of the present disclosure.

FIG. 2A depicts a cross section of x-ray detection device 200 in accordance with various embodiments of the present disclosure. X-ray detection device 200 is an example of a capacitor configured to be an x-ray sensor. X-ray detection device 200 includes circuit board 202, copper pads 204, end caps 206, sensing material 212, and dielectric 214. Circuit board 202, copper pads 204, end caps 206, and sensing material 212 are consistent with circuit board 102, copper pads 104, end caps 106, and sensing material 112.

Dielectric 214 can include any material known to act as a dielectric.

Figure 2B:
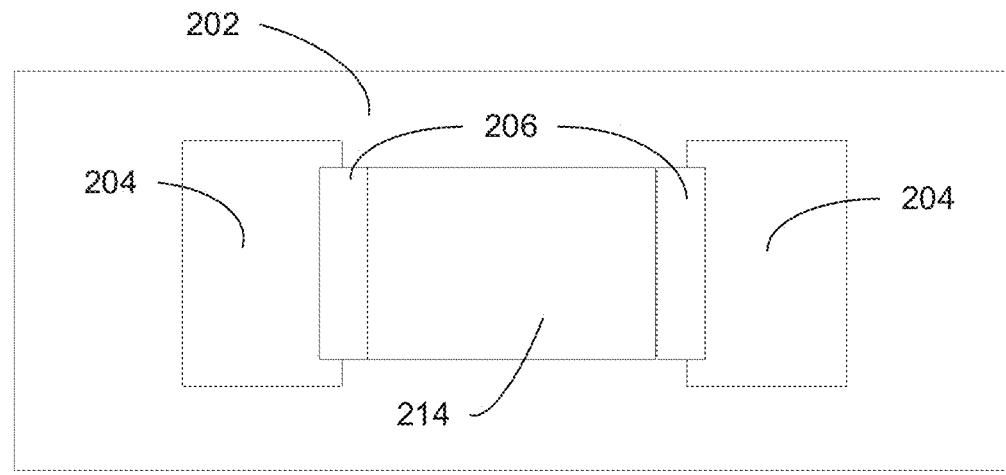
FIG. 2B illustrates a top down view of a capacitor configured as an x-ray detection device in accordance with some embodiments of the present disclosure.

FIG. 2B depicts a top down view of x-ray detection device 200 consistent with embodiments of the present disclosure. Circuit board 202, Copper pads 204, end caps 206, and dielectric 214 are depicted. Sensing material 212 is blocked from view by dielectric 214.

Figure 2C:
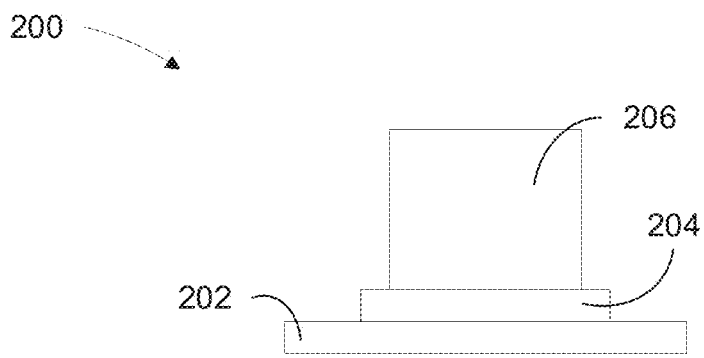
FIG. 2C illustrates a side view of a capacitor configured as an x-ray detection device in accordance with some embodiments of the present disclosure.

FIG. 2C depicts a longitudinal view of x-ray detection device 200 consistent with embodiments of the present disclosure. Circuit board 202, Copper pads 204, and end caps 206 are depicted. The other components are blocked from view.

X-ray detection device 200 can be configured such that the first state of sensing material 212 acts as an insulator with a first conductivity. In that case, the only flow path for current through x-ray detection device 200 is from circuit board 202 through copper pad 204 to end cap 206. Dielectric 214 and the first state of sensing material 212 prevents current flow between the end caps 206 (e.g., the device acts as a typical capacitor). After an x-ray inspection of the device, sensing material 212 can switch to a semi-conductor having the second conductivity and allow for an electrical flow path between the end caps 206 through sensing material 212. The second electrical flow path will change the overall characteristics of the circuit. Those changes can be measured and reveal the x-ray inspection has occurred.

Figure 3A:
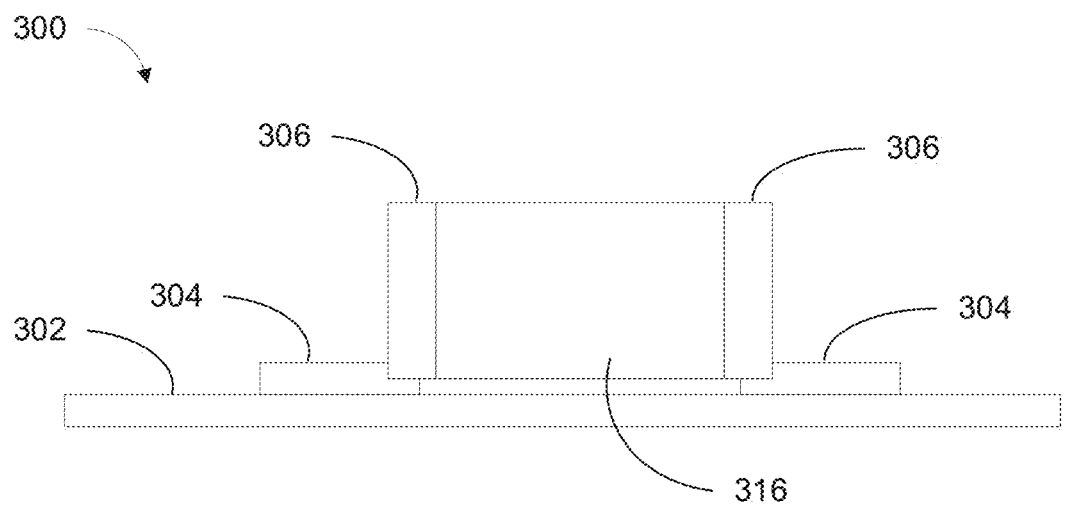
FIG. 3A illustrates a cross-section of an inductor configured as an x-ray detection device in accordance with some embodiments of the present disclosure.

FIG. 3A depicts a cross section of x-ray detection device 300 in accordance with various embodiments of the present disclosure. X-ray detection device 300 is an example of an inductor configured to be an x-ray sensor. X-ray detection device 300 includes circuit board 302, copper pads 304, end caps 306, sensing material 312, and inductor 316. Circuit board 302, copper pads 304, end caps 306, and sensing material 312 are consistent with circuit board 102, copper pads 104, end caps 106, and sensing material 112. Sensing material 312 is not depicted in FIG. 3A. It can be arranged such that it is parallel to inductor 316 on one or more sides of inductor 316 as shown if FIG. 2B.

Inductor 316 can be any material known that acts as an inductor.

Figure 3B:
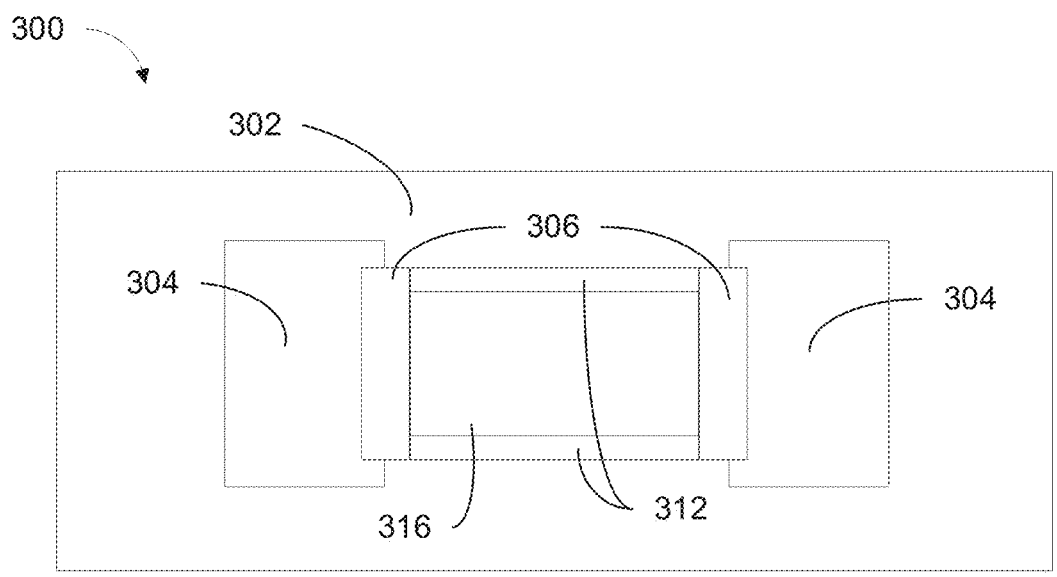
FIG. 3B illustrates a top down view of an inductor configured as an x-ray detection device in accordance with some embodiments of the present disclosure.

FIG. 3B depicts a top down view of x-ray detection device 300 consistent with embodiments of the present disclosure. Circuit board 302, Copper pads 304, end caps 306, sensing material 312, and inductor 316 are depicted. In some embodiments, sensing material 312 can be configured in any arrangement as to create a potential circuit between end caps 306. X-ray sensing device 300 depicts sensing material 312 placed along the side of inductor 316, where FIGS. 1 and 2 shows sensing material 112, and 212 below the insulator 110 and dielectric 214. In some embodiments, sensing material 312 can be placed in any combination of locations surrounding inductor 316, such that, when in the semi-conducting state, current can flow through sensing material 312.

Figure 3C:
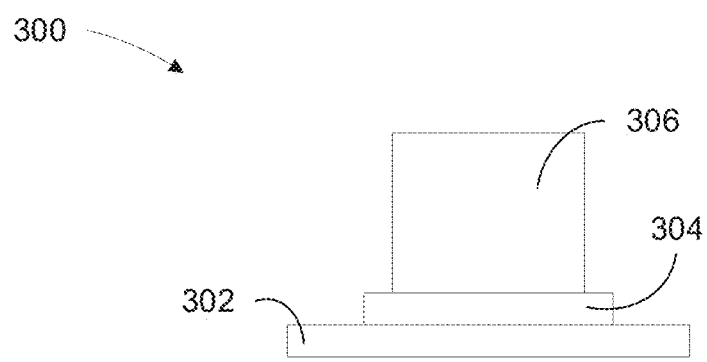
FIG. 3C illustrates a side view of an inductor configured as an x-ray detection device in accordance with some embodiments of the present disclosure.

FIG. 3C depicts a side view of x-ray detection device 300 consistent with embodiments of the present disclosure. Circuit board 302, Copper pads 304, and end caps 306 are depicted. The other components are blocked from view.

X-ray detection device 300 can be configured such that the first state of sensing material 312 acts as an insulator having a first conductivity. In that case, the only flow path for current through x-ray detection device 300 is from circuit board 302 through copper pad 304, end cap 306, inductor 316, through the other end cap 306, copper pad 304 and back to circuit board 302. After an x-ray inspection of the device, sensing material 312 can switch to a semi-conductor having a second conductivity and allow for a second electrical flow path through sensing material 312. The additional electrical flow path will change the overall characteristics of the circuit. Those changes can be measured and reveal the x-ray inspection has occurred.

FIGS. 1-3 and the components depicted in FIGS. 1-3 are not necessarily representative of the actual size of the components or subcomponents individually or collectively. They are not a representation of the actual or relative size of any device, component of subcomponent. Rather, they are meant to illustrate how each sub-component of an x-ray sensing device can be arranged relative to other sub-components in accordance with various embodiments of the present disclosure.

Figure 4A:
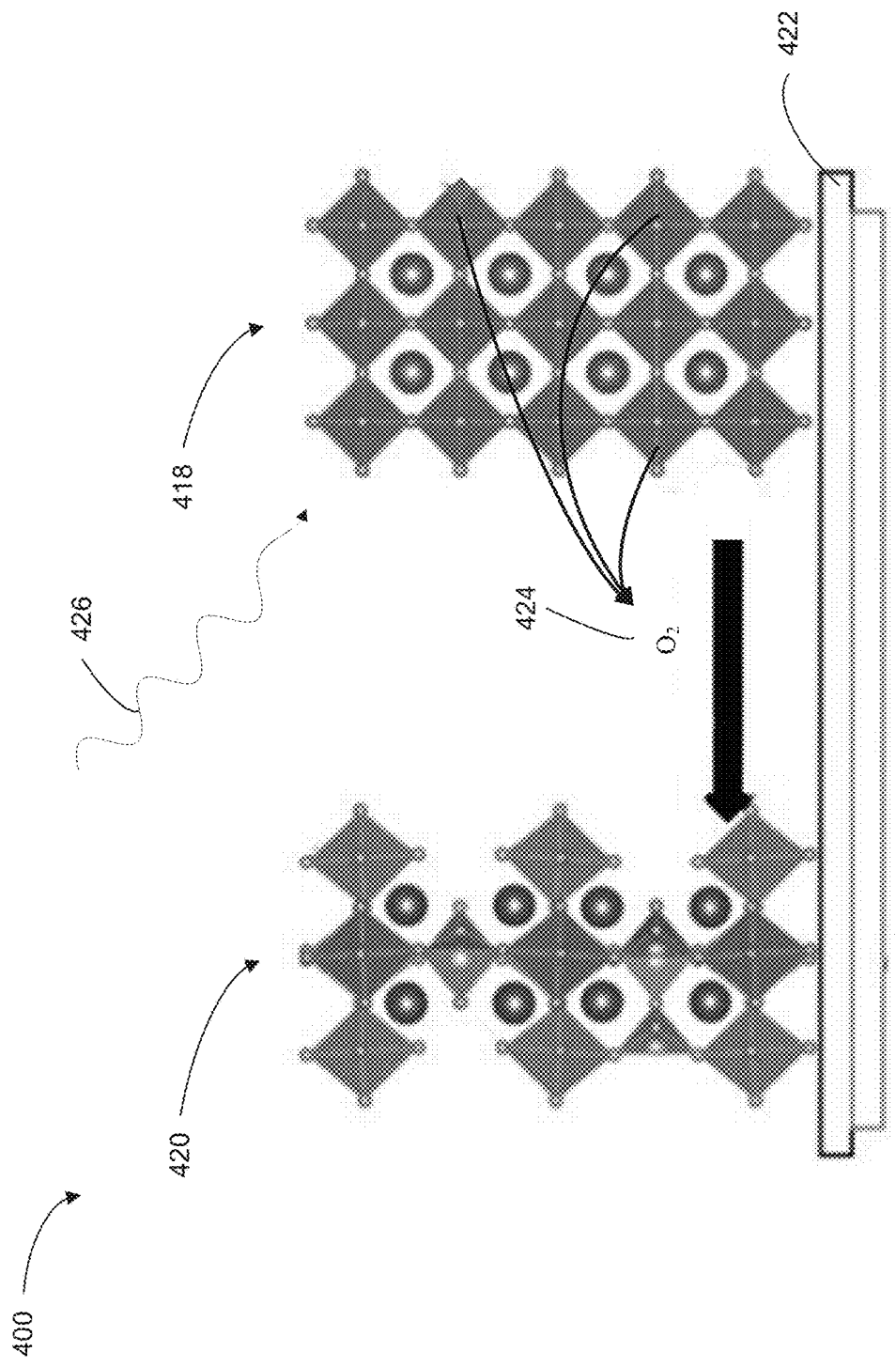
FIG. 4A illustrates an example of a material changing states in the presence of electromagnetic radiation in accordance with some embodiments of the present disclosure.

FIG. 4A depicts a sensing material (e.g., sensing material 112, 212, and/or 312) generally labeled 400, transitioning from a first to a second state consistent with one or more embodiments of the present disclosure. FIG. 4A includes first state 418, second state 420, catalyst 422, excess oxygen 424 and x-ray beam 426.

In some embodiments, the sensing material 400 is strontium cobaltite and the first state 418 is arranged in a perovskite structure. In some embodiments, perovskite acts as a semiconductor and/or insulator. In some embodiments, second state 420 is arranged in a brownmillerite structure. In some embodiments, brownmillerite acts as a conductor. In alternative embodiments, the first state 418 can the brownmillerite structure and the second state 420 the perovskite structure.

In some embodiments, sensing material 400 is deposited on catalyst 422. In some embodiments, catalyst 422 can be any material that will assist a transition of sensing material 400 between first state 418 and second state 420. In some embodiments, catalyst 422 is made from yttrium-stabilized zirconia. In some embodiments, catalyst 422 can be a source of and a sink for excess oxygen 424. Excess oxygen 424 can be oxygen molecules, atoms, and/or ions that that absorb into and/or diffuse out of sensing material 400 during transformation between the two states. It is not necessarily required that catalyst 422 actually provide or store excess oxygen 424, rather that it enable the transfer of and reaction of excess oxygen 424 during the transition of sensing material 400.

In some embodiments, the transition from the first state 418 to the second state 420 is caused by voltage generated from x-ray beam 426. In some embodiments, the voltage at which sensing material 400 transitions from the first state 418 to the second state 420 is approximately 30 millivolts. In some embodiments, the voltage at which sensing material 400 transitions from the first state to the second state ranges from about 5 millivolts to about 50 millivolts.

X-ray beam 426 can be any type of x-ray. An x-ray is a form of electromagnetic radiation. X-rays have a wavelength ranging from about 0.01 nanometers to about 10 nanometers. X-ray wavelengths fall between the shorter gamma rays and longer ultraviolet rays. For purposes of this application, the term x-ray can include some wavelengths of electromagnetic radiation considered gamma and ultraviolet. In some embodiments, x-ray beam 426 is generated by an x-ray machine during an inspection. In some embodiments, x-ray beam 426 is generated by an inspection device.

In some embodiments, x-ray beam 426 creates a voltage in first structure 418. In such embodiments, the voltage caused by x-ray beam 426 causes excess oxygen 424 to leave first structure 418. When excess oxygen 424 leaves first structure 418, sensing material 400 undergoes the transformation to second structure 420. In some embodiments, the voltage generated by x-ray beam 426 is about 30 millivolts.

Figure 4B:
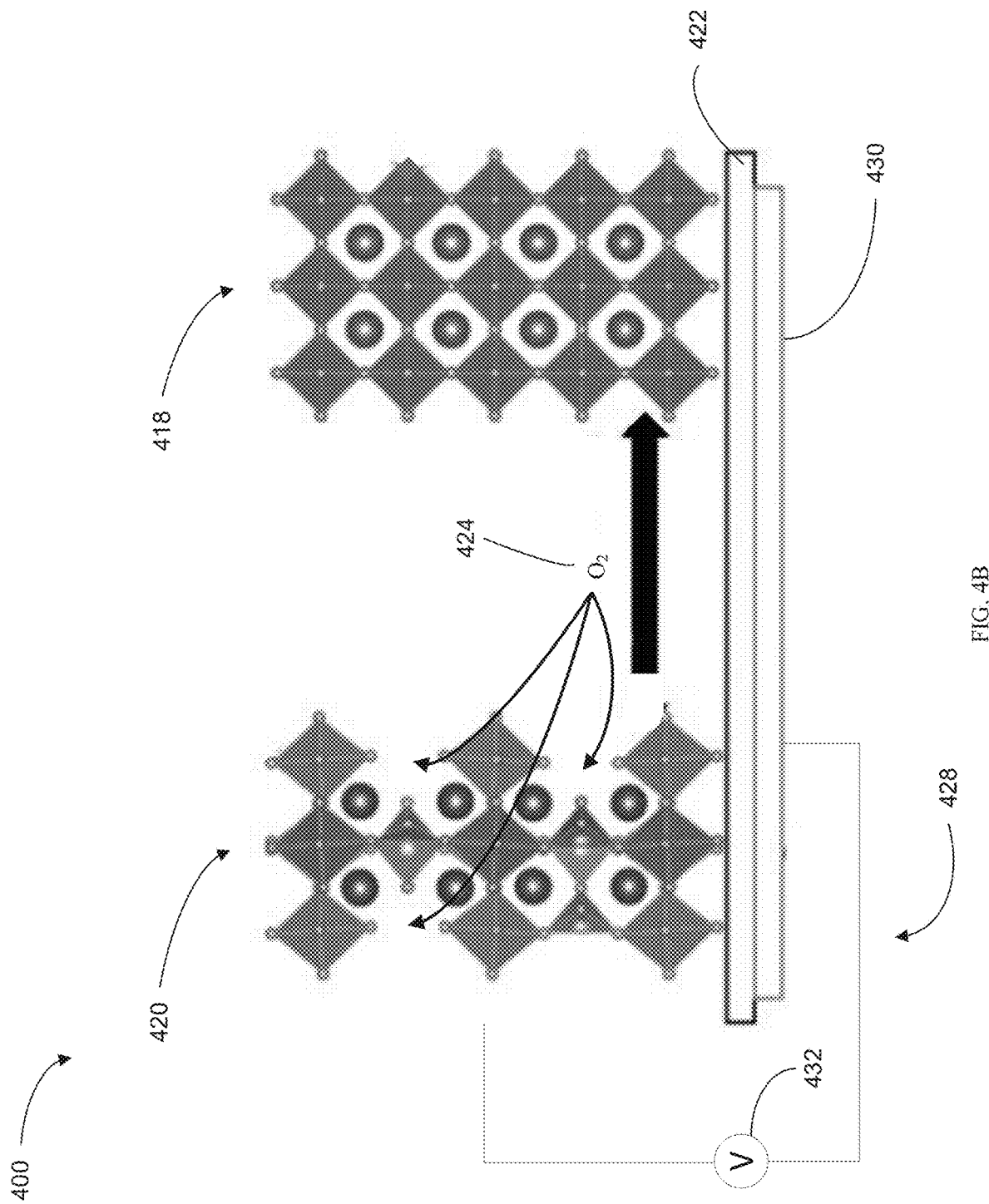
FIG. 4B illustrates the material changing states in the presence of a voltage in accordance with some embodiments of the present disclosure.

FIG. 4B depicts sensing material 400 transitioning from second state 420 to first state 418 consistent with various embodiments of the present disclosure. FIG. 4B includes first state 418, second state 420, catalyst 422, excess oxygen 424, and recharging circuit 428. First state 418, second state 420, catalyst 422, and excess oxygen 424 are as described in relation to FIG. 4A.

In some embodiments, sensing material 400 is transformed from second state 420 to first state 418 by recharging circuit 428. Recharging circuit 428 is any circuit capable of provide a voltage to second structure 420. In some embodiments, the voltage produced by recharging circuit 428 is approximately equal in magnitude but opposite in direction of the voltage created by x-ray beam 426 of FIG. 4A. In some embodiments, the voltage produced by recharging circuit 428 is about 30 millivolts in magnitude. In some embodiments, the voltage at which sensing material 400 transitions from the second state 420 to the first state 418 is approximately 30 millivolts. In some embodiments, the voltage at which sensing material 400 transitions from the second state 420 to the first state 418 ranges from about 5 millivolts to about 50 millivolts.

Recharging circuit 428 further includes counter electrodes 430, and voltage source 432. Counter electrode 430 can be any material capable of producing a voltage across sensing material 400. In some embodiments, counter electrode 430 is electrically connected to catalyst 422 and/or sensing material 400.

Voltage source 432 can be any component capable of producing a voltage. In some embodiments voltage source 432 is independent of any other components (e.g. a battery on a common circuit board, or a separate device). In some embodiments, voltage source 432 is interconnected with a circuit that contains one or more x-ray sensing devices (e.g., 100, 200, and/or 300).

In some embodiments, recharging circuit 428 creates a voltage in second state 420. In some embodiments, the voltage created in second state 420 by recharging circuit 428 causes excess oxygen 424 to enter sensing material 400. In these embodiments, excess oxygen in second state 420 causes the transformation to first state 418.

Figure 5:
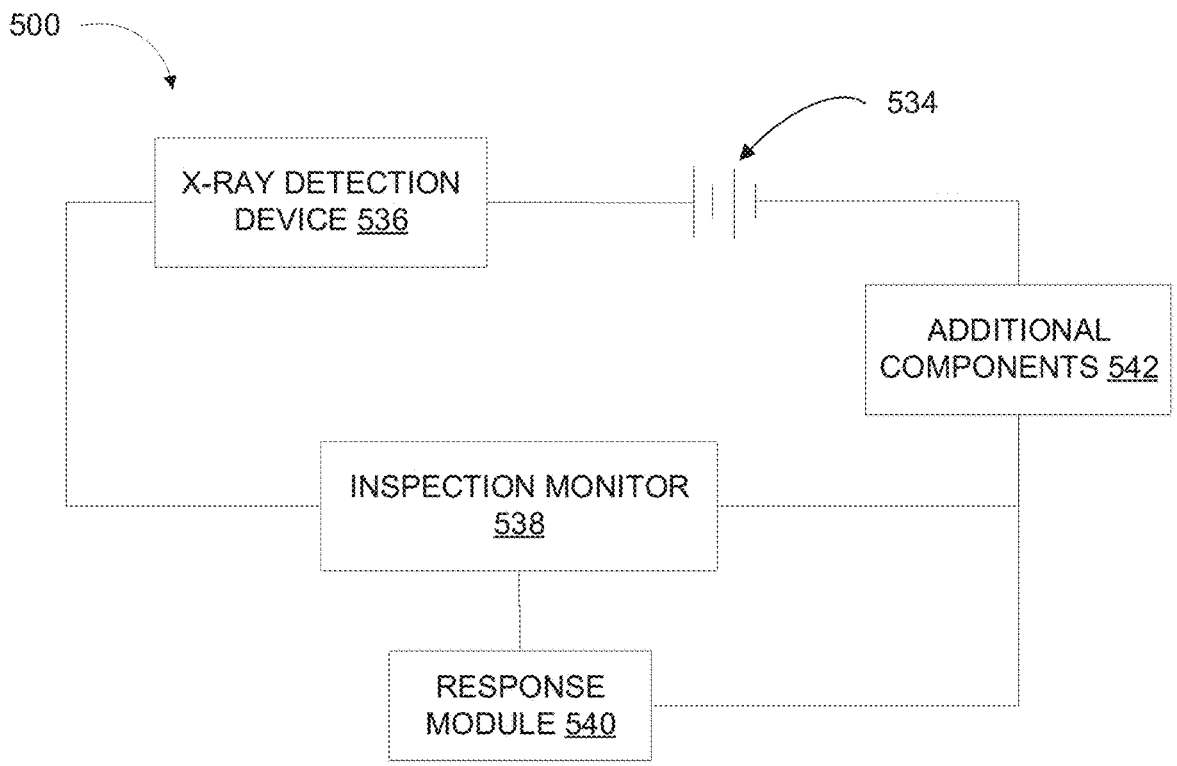
FIG. 5 illustrates an example x-ray detecting circuit in accordance with some embodiments of the present disclosure.

FIG. 5 depicts an x-ray detecting circuit 500, consistent with various embodiments of the present disclosure. X-ray sensing circuit 500 is one demonstrative embodiment of an x-ray sensing device (e.g., 100, 200, and/or 300) deployed in a circuit. X-ray sensing circuit 500 includes power source 534, x-ray detection device 536, inspection monitor 538, response module 540, and additional components 542.

Power source 534 can be any device that can power a circuit. In some embodiments, power source 534 is a battery.

In some embodiments, power source 534 is the power supply for the circuit board on which the x-ray detecting circuit 500 is placed.

X-ray detection device 536 can be any component configured to detect x-rays. In some embodiments, x-ray detection device 536 is one or more of x-ray detecting device 100, 200, and/or 300.

Inspection monitor 538 is configured to determine when x-ray detection device 536 is activated or detects an x-ray. In some embodiments, inspection monitor 538 is a component that monitors parameters of x-ray detection circuit 500. The parameters monitored can be one or more of voltage, current, inductance, temperature, conductivity, or other similar parameters. In some embodiments, inspection monitor 538 detects x-ray intrusion in response to a change in one or more of the parameters above a change threshold for a duration exceeding a duration threshold. In some embodiments, inspection monitor 538 can include software components to determine x-ray detection device 536 has been activated. In some embodiments, inspection monitor 538 is configured to activate response module 540 in response to determining that x-ray detection device 536 is activated.

Response module 540 can perform an action in response to inspection monitor 538 determining x-ray device 536 has been activated. In some embodiments, the response module 540 can be configured to cause a predetermined result. In some embodiments, the result can be a notification. The notification can be any process or action that can cause a person or machine to know an x-ray inspection has occurred. In some embodiments, the action can be observable, such as turning on a light or initiating an audible sound. In some embodiments, the action can be a process such as altering performance of a machine or generating an email message.

Additional components 542 can be any and all other components comprising x-ray detection circuit 500. In some embodiments, additional components 542 can be located at any location along the circuit. In some embodiments, additional components 542 can be both before and after any other components in detection circuit 500.

In some embodiments, x-ray sensing circuit 500 can include a current limiting device (not shown). The current limiting device can be configured to prevent overheating. For example, in an embodiment where x-ray detection device 536 creates a short in the circuit when activated, there is a potential that a component in x-ray sensing circuit 500 could overheat due to the rush in current. Adding a current limiting device can prevent overheating, at least for a time period sufficient to determine an x-ray inspection has occurred.

Figure 6:
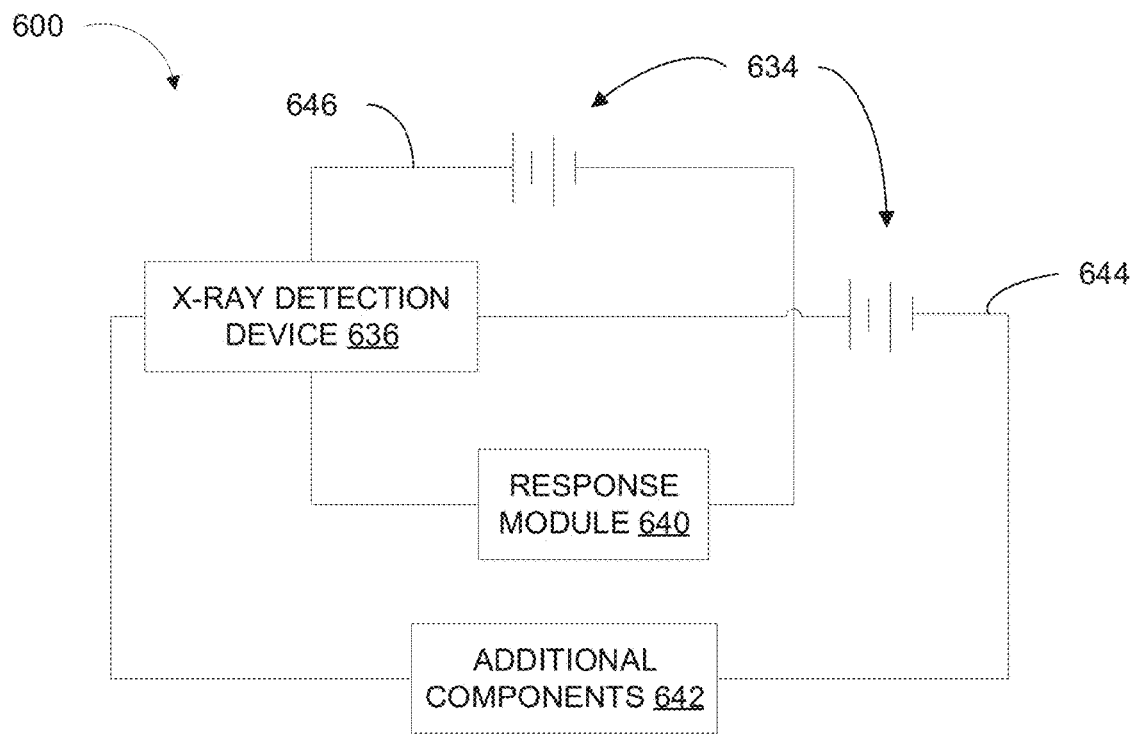
FIG. 6 illustrates an example x-ray detecting system in accordance with some embodiments of the present disclosure.

FIG. 6 depicts an x-ray sensing system 600, including an x-ray sensing circuit 646 distinct from a primary circuit 644 consistent with various embodiments of the present disclosure. A system can be two or more components working in unison. For example, a system of two interconnected circuits, with each circuit comprising respective components, can be a system.

Primary circuit 644 can be any circuit comprising various components. For example, it can be a circuit that makes up a portion of a computing device. Primary circuit 644 can include a power source 634, x-ray detection device 636, and additional components 642. Power source 634, x-ray detection device 636, and additional components 642 can be consistent with power source 534, x-ray detection device 536 and additional components 542 of FIG. 5, respectively. In some embodiments, primary circuit 644 can have a plurality of x-ray detection devices 636 arranged in parallel, in series, or in a combination of parallel and series.

Sensing circuit 646 can include power source 634, x-ray detection device 636, and response module 640. Power source 634, x-ray detection device 636, and response module 640 can be consistent with power source 534, x-ray detection device 536, and response module 540 of FIG. 5, respectively. In some embodiments, sensing circuit 646 can include an inspection monitor (not shown), that is consistent with inspection monitor 538 of FIG. 5. In some embodiments, sensing circuit 646 can include a current limiting device (not shown). The current limiting device can be configured to prevent overheating. For example, in an embodiment where x-ray detection device 636 creates a short in the circuit when activated, there is a potential the component could overheat due to the rush of current. Adding a current limiting device can prevent overheating, at least for a time period sufficient to determine and x-ray inspection has occurred.

In some embodiments, primary circuit 644 and secondary circuit 646 can be various branches of a larger circuit. In some embodiments, a single power source 634 can provide the power for primary circuit 644 and sensing circuit 646.

In some embodiments, x-ray sensing system 600 can include additional circuits (not shown). In some embodiments, an additional circuit can be a recharging circuit as described in relation to FIG. 4B. In some embodiments, x-ray sensing system 600 can include one or more sensing circuits each monitoring one or more x-ray detection devices 636.

Figure 7:
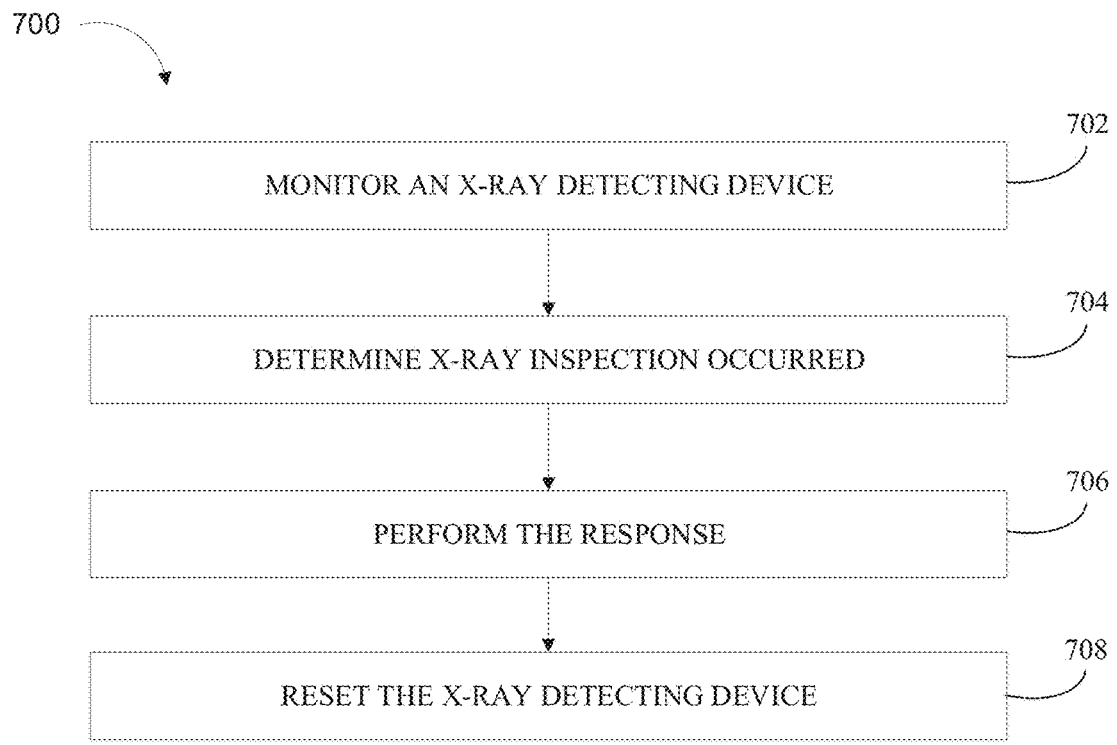
FIG. 7 illustrates a flowchart of an example method for detecting an x-ray inspection in accordance with some embodiments of the present disclosure.

FIG. 7 is a flowchart depicting a method 700 for detecting a non-intrusive inspection with the use of an x-ray inspection device. FIG. 7 provides an illustration of one implementation and does not imply any limitations with regard to the environments in which different embodiments may be implemented. Method 700 can include more or fewer operations than those operations that are explicitly depicted. Method 700 can include operations in different orders than those orders depicted. Likewise, the method 700 can include operations that occur simultaneously rather than sequentially. Many modifications to the depicted method may be made by those skilled in the art without departing from the spirit and scope of the present disclosure. Method 700 will describe operation using x-ray detection device 100, however, x-ray detection device 200, and/or 300 can also be used.

At 702, an inspection detection system monitors an x-ray detecting device. In some embodiments, the system monitors a plurality of x-ray detecting devices. In some embodiments, the x-ray detecting device is consistent with an x-ray detection device 100. In some embodiments, monitoring comprising repeatedly measuring one or more parameters (e.g., voltage, current, resistance, conductivity, temperature, etc.) of the x-ray detecting device.

At 704, the inspection detection system determines an x-ray inspection occurred. In some embodiments, the system determines the inspection occurred in response to an x-ray sensing material (e.g., 112, 212, and/or 312) changing from the first state to the second state. In some embodiments, the system utilizes an inspection monitor, consistent with inspection monitor 538 of FIG. 5, to determine the inspection occurred. In some embodiments, the system utilizes a response module, consistent with response module 640 of FIG. 6, to determine the inspection occurred. In some embodiments, the inspection is determined by a change in operation of a circuit, such as x-ray sensing circuit 500. In some embodiments, the change in operation is associated with a change in one or more monitored parameters (e.g., voltage, current, resistance, conductivity, temperature, etc.)

above a change threshold and (optionally) having a duration exceeding a duration threshold.

At 706, the inspection detection system performs a response. In some embodiments, the response is performed by a response module, consistent with response module 540 of FIG. 5 or response module 640 of FIG. 6. In some embodiments, the response occurs automatically. In some embodiments, the response can be delayed. For example, if the inspection occurred while the component is deenergized, the response can be performed after the circuit has been reenergized. As another example, if the response is to send an email, the response can be delayed until a network connection is detected.

At 708, the inspection detection system resets the x-ray detecting device. In some embodiments, the x-ray detecting device is reset by causing the x-ray sensitive material to transform from the second state to the first state. In some embodiments, the x-ray detecting device is reset by applying a voltage across the x-ray sensitive material. In these embodiments, the voltage can be the opposite of the voltage that caused the x-ray sensing material to transform from the first state to the second state (e.g., a negative voltage, or voltage applied in the opposite direction). For example, if a voltage of 30 millivolts caused the x-ray sensitive material to transform from the first state to the second state, a voltage of −30 millivolts would be the opposite voltage. In some embodiments, the x-ray detection device is reset by a recharging circuit, consistent with recharging circuit 428 of FIG. 4B.

Figure 8:
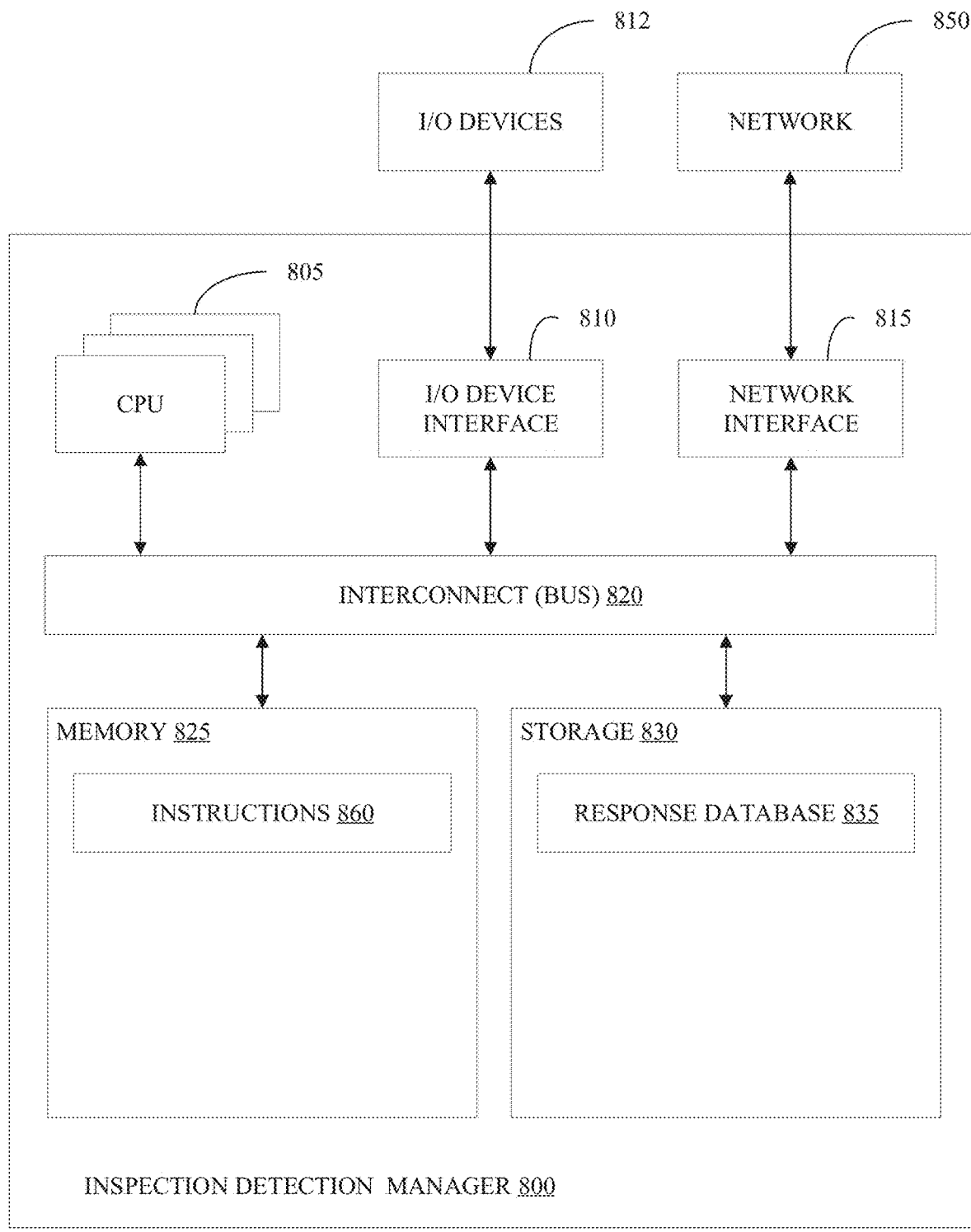
FIG. 8 illustrates a block diagram of an example inspection detection manager in accordance with some embodiments of the present disclosure.

FIG. 8 illustrates a block diagram of an example inspection detection manager 800 in accordance with some embodiments of the present disclosure. In various embodiments inspection detection manager 800 can operate x-ray sensing devices 100, 200, and/or 300, of FIGS. 1-3, manage recharging circuit 428, x-ray sensing circuit 500, and/or x-ray sensing system 600 of FIGS. 4-6, and perform the method 700 described in FIG. 7. In some embodiments, inspection detection manager 800 provides instructions for the operation of x-ray sensing devices 100, 200, and/or 300, of FIGS. 1-3, recharging circuit 428, x-ray sensing circuit 500, and/or x-ray sensing system 600 of FIGS. 4-6, and/or to perform the method 700 described in FIG. 7 to a client machine such that the client machine executes the method, or a portion of the method, based on the instructions provided by the inspection detection manager 800.

The inspection detection manager 800 includes a memory 825, storage 830, an interconnect (e.g., BUS) 820, one or more CPUs 805 (also referred to as processors 805 herein), an I/O device interface 810, I/O devices 812, and a network interface 815.

Each CPU 805 retrieves and executes programming instructions stored in the memory 825 or storage 830. The interconnect 820 is used to move data, such as programming instructions, between the CPUs 805, I/O device interface 810, storage 830, network interface 815, and memory 825. The interconnect 820 can be implemented using one or more busses. The CPUs 805 can be a single CPU, multiple CPUs, or a single CPU having multiple processing cores in various embodiments. In some embodiments, a CPU 805 can be a digital signal processor (DSP). In some embodiments, CPU 805 can be a digital signal processor (DSP). In some embodiments, CPU 805 includes one or more 3D integrated circuits (3DICs) (e.g., 3D wafer-level packaging (3DWLP), 3D interposer based integration, 3D stacked ICs (3D-SICs), monolithic 3D ICs, 3D heterogeneous integration, 3D system in package (3DSiP), and/or package on package (PoP CPU configurations). Memory 825 is generally included to be representative of a non-volatile memory, such as a hard disk drive, solid state device (SSD), removable memory cards, optical storage, or flash memory devices. In an alternative embodiment, the storage 830 can be replaced by storage-area-network (SAN) devices, the cloud, or other devices connected to the inspection detection manager 800 via the I/O device interface 810 or a network 850 via the network interface 815.

In some embodiments, the memory 825 stores instructions 860 and the storage 830 stores response database 835. However, in various embodiments, the instructions 860 and response database 835 are stored partially in memory 825 and partially in storage 830, or they are stored entirely in memory 825 or entirely in storage 830, or they are accessed over a network 850 via the network interface 815.

Instructions 860 can be processor-executable instructions for controlling/operating x-ray sensing devices 100, 200, and/or 300, of FIGS. 1-3, recharging circuit 428, x-ray sensing circuit 500, and/or x-ray sensing system 600 of FIGS. 4-6, and/or performing any portion of, or all of, any of the method 700 of FIG. 7.

Response database 835 can be information relating to the potential responses that can be performed by recharging circuit 428, x-ray sensing circuit 500, and/or x-ray sensing system 600 of FIGS. 4-6, or during performance of any portion of, or all of, any of the method 700 of FIG. 7.

In various embodiments, the I/O devices 812 include an interface capable of presenting information and receiving input. For example, I/O device 812 can present information to a user interacting with inspection detection manager 800 and receive input from the user.

Inspection detection manager 800 is connected to the network 850 via the network interface 815. Network 850 can comprise a physical, wireless, cellular, or different network.

Embodiments of the present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instruction can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instruction can also be stored in a computer readable storage medium that can direct a computer, a programmable data processing apparatus, and/or other devices to function in a particular manner, such that the computer readable storage medium having instructions stored therein comprises an article of manufacture including instructions which implement aspect of the function/act specified in the flowchart and/or block diagram block or blocks.

The computer readable program instruction can also be loaded onto a computer, other programmable data processing apparatus, or other device to cause a series of operations steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or subset of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While it is understood that the process software (e.g., any of the instructions stored in instructions 860 of FIG. 8 and/or any software configured to control the devices and circuits of FIG. 1-6 and perform any subset of the methods described with respect to FIG. 7) can be deployed by manually loading it directly in the client, server, and proxy computers via loading a storage medium such as a CD, DVD, etc., the process software can also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by executing a set of program instructions that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then it will be stored on the proxy server.

Embodiments of the present invention can also be delivered as part of a service engagement with a client corporation, nonprofit organization, government entity, internal organizational structure, or the like. These embodiments can include configuring a computer system to perform, and deploying software, hardware, and web services that implement, some or all of the methods described herein. These embodiments can also include analyzing the client's operations, creating recommendations responsive to the analysis, building systems that implement subsets of the recommendations, integrating the systems into existing processes and infrastructure, metering use of the systems, allocating expenses to users of the systems, and billing, invoicing (e.g., generating an invoice), or otherwise receiving payment for use of the systems.

What is claimed is:

1. A device for detecting x-rays, the device comprising:
an electrical component comprising a first end cap and a second end cap;
an x-ray sensitive material physically contacting the first end cap and the second end cap, wherein the x-ray sensitive material has a first state having a first conductivity, and wherein the x-ray sensitive material has a second state having a second conductivity; and
wherein the x-ray sensitive material is configured to transform from the first state into the second state in response to the x-ray sensitive material being exposed to an initiating voltage, and the x-ray sensitive material is strontium cobaltite.

2. The device of claim 1, wherein the initiating voltage is caused by electromagnetic radiation.

3. The device of claim 1, wherein the x-ray sensitive material acts as a semiconductor in the first state, wherein the x-ray sensitive material acts as a conductor in the second state.

4. The device of claim 1, further comprising:
a circuit, wherein the electrical component is configured to perform a function in the circuit, the circuit comprising:
a power source and at least one additional component.

5. The device of claim 4, further comprising a response module, wherein the response module is configured to perform an action, and wherein the response module is configured to perform the action when the x-ray sensitive material is in the second state.

6. The device of claim 4, further comprising a recharging circuit, wherein the recharging circuit is configured to apply a restoring voltage to the x-ray sensitive material, wherein the restoring voltage is opposite to the initiating voltage.

7. The device of claim 6, wherein the x-ray sensitive material transforms from the second state to the first state in response to the restoring voltage.

8. The device of claim 1, wherein the initiating voltage is approximately 30 millivolts.

9. The device of claim 1, wherein the initiating voltage is from about 5 millivolts to about 60 millivolts.

10. The device of claim 1, wherein the x-ray sensitive material is deposited on a catalyst, the catalyst comprising yttrium-stabilized zirconia.

11. A method comprising:
monitoring a first x-ray detecting device, wherein the first x-ray detecting device comprises an x-ray sensitive material physically contacting a first end cap and a second end cap, wherein the x-ray sensitive material has a first state having a first conductivity, wherein the x-ray sensitive material has a second state having a second conductivity, wherein the x-ray sensitive material is configured to transform from the first state to the second state in response to an initiating voltage, and the x-ray sensitive material is strontium cobaltite;
determining an x-ray inspection occurred by detecting a change in conductivity between the first end cap and the second end cap; and
performing, in response to determining the x-ray inspection occurred, an action.

12. The method of claim 11, wherein the first x-ray detecting device is configured to perform a function in a circuit, the circuit comprising a plurality of electrical components.

13. The method of claim 12, wherein the change in conductivity between the first end cap and the second end cap is caused by the x-ray sensitive material transforming from the first state to the second state.

14. The method of claim 13, further comprising:
restoring the x-ray sensitive material from the second state to the first state by applying a restoring voltage to the x-ray sensitive material, wherein the restoring voltage is opposite of the initiating voltage.

15. A device for detecting x-rays, the device comprising:
an electrical component comprising a first end cap and a second end cap;
strontium cobaltite physically contacting the first end cap and the second end cap, wherein strontium cobaltite has a first state having a first conductivity, and wherein strontium cobaltite has a second state having a second conductivity; and
a component for measuring conductivity between the first end cap and the second end cap.

16. The device of claim 15, wherein the first state comprises a perovskite structure.

17. The device of claim 15, wherein the second state comprises a brownmillerite structure.

18. The device of claim 15, wherein the strontium cobaltite is configured to transform from the first state into the second state in response to the strontium cobaltite being exposed to electromagnetic radiation.

19. The device of claim 15, wherein the strontium cobaltite is deposited on a catalyst, the catalyst comprising yttrium-stabilized zirconia.

* * * * *